United States Patent
Jeong

(10) Patent No.: US 9,019,793 B1
(45) Date of Patent: Apr. 28, 2015

(54) SEMICONDUCTOR DEVICES

(71) Applicant: SK Hynix Inc., Incheon-si Gyeonggi-do (KR)

(72) Inventor: Gwang Young Stanley Jeong, Dublin, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/174,766

(22) Filed: Feb. 6, 2014

(51) Int. Cl.
*G11C 11/418* (2006.01)
*G11C 17/16* (2006.01)
*G11C 17/18* (2006.01)
*G11C 5/14* (2006.01)

(52) U.S. Cl.
CPC .............. *G11C 17/16* (2013.01); *G11C 17/18* (2013.01); *G11C 5/148* (2013.01); *G11C 5/147* (2013.01)

(58) Field of Classification Search
CPC .......................................... G11C 5/147–5/148
USPC ........................................... 365/96, 229, 200
See application file for complete search history.

(56) References Cited

U.S. PATENT DOCUMENTS

| | | | |
|---|---|---|---|
| 6,212,089 B1* | 4/2001 | Kajigaya et al. | 365/51 |
| 6,462,985 B2* | 10/2002 | Hosono et al. | 365/185.09 |
| 6,668,344 B1* | 12/2003 | Sakata et al. | 714/710 |
| 7,990,189 B2 | 8/2011 | Shin | |
| 2002/0170019 A1* | 11/2002 | Hsu et al. | 716/1 |
| 2003/0095449 A1* | 5/2003 | Kato | 365/200 |
| 2004/0179412 A1* | 9/2004 | Lehmann et al. | 365/200 |
| 2005/0024956 A1* | 2/2005 | Tran et al. | 365/200 |

FOREIGN PATENT DOCUMENTS

KR  1020060087086 A  8/2006

* cited by examiner

*Primary Examiner* — Hoai V Ho
*Assistant Examiner* — Jay Radke
(74) *Attorney, Agent, or Firm* — William Park & Associates Ltd.

(57) ABSTRACT

The semiconductor device includes a fuse data storage unit, a power source signal generator and a redundancy signal generator. The fuse data storage unit generates a section signal, a fuse clock signal, a fuse reset signal and a fuse data in response to a first power-up signal generated from a power supply voltage signal. The redundancy signal generator generates a fuse set signal that is counted in response to the fuse clock signal, generates an input reset signal and an input set signal from the fuse set signal and the fuse reset signal in response to the section signal, and latches the fuse data in response to the input reset signal and the input set signal to generate a redundancy signal.

26 Claims, 7 Drawing Sheets

SEMICONDUCTOR DEVICES

BACKGROUND

1. Technical Field

Embodiments of the present disclosure generally relate to semiconductor devices and more particularly to semiconductor devices including a fuse data storage unit and a redundancy signal generator.

2. Related Art

Semiconductor devices may be regarded as failed devices if at least one of memory cells included in each of the semiconductor devices abnormally operates. As the semiconductor devices become more highly integrated, the number of the failed devices has been continuously increased. Thus, the semiconductor devices may be designed to include redundancy cells. That is, if the semiconductor device has abnormal memory cells, a repair operation may be executed to replace the abnormal memory cells with the redundancy cells. The semiconductor device may store information on the abnormal memory cells therein to execute the repair operation.

Each of the semiconductor devices may be designed to include fuses that store information necessary for various internal control operations, for example, the information on the abnormal memory cells. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices.

According to some embodiments, a semiconductor device includes a fuse data storage unit and a redundancy signal generator. The fuse data storage unit generates a section signal, a fuse clock signal, a fuse reset signal and a fuse data in response to a first power-up signal generated from a power supply voltage signal. The redundancy signal generator generates a fuse set signal that is counted in response to the fuse clock signal, generates an input reset signal and an input set signal from the fuse set signal and the fuse reset signal in response to a section signal, and latches the fuse data in response to the input reset signal and the input set signal to generate a redundancy signal.

According to further embodiments, a semiconductor device includes a power source signal generator and a redundancy signal generator. The power source signal generator generates a fuse power source signal driven to have a power supply voltage signal. The fuse power source signal is generated to have a lower level than the power supply voltage signal by a certain level in a deep power-down mode. The redundancy signal generator generates a fuse set signal that is counted in response to a fuse clock signal, generates an input reset signal and an input set signal from the fuse set signal and a fuse reset signal in response to a section signal, and latches the fuse data in response to the input reset signal and the input set signal to generate a redundancy signal.

BRIEF DESCRIPTION OF THE DRAWINGS

Embodiments of the present invention will become more apparent in view of the attached drawings and accompanying detailed description, in which.

DETAILED DESCRIPTION OF THE EMBODIMENTS

Embodiments of the present invention will be described hereinafter with reference to the accompanying drawings. However, the embodiments described herein are for illustrative purposes only and are not intended to limit the scope of the invention.

Figure 1:
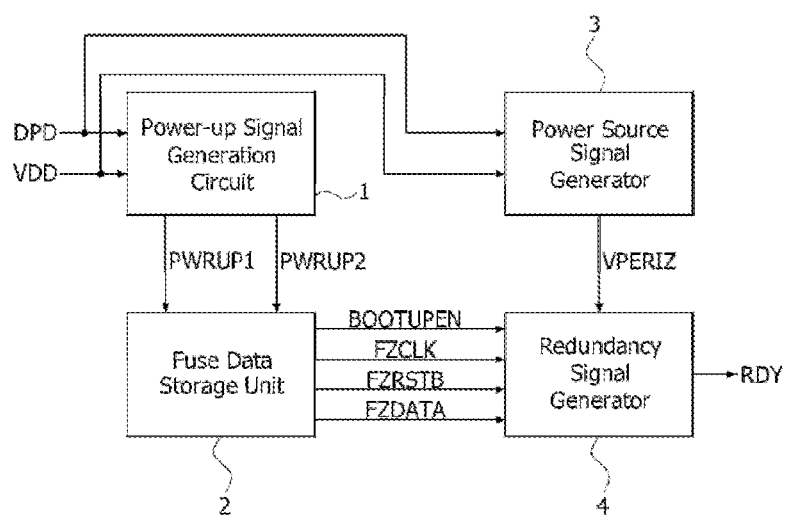
FIG. 1 is a block diagram illustrating a semiconductor device according to some embodiments of the present invention.

Referring to FIG. 1, a semiconductor device according to some embodiments may include a power-up signal generation circuit 1, a fuse data storage unit 2, a power source signal generator 3 and a redundancy signal generator 4.

The power-up signal generation circuit 1 may generate a first power-up signal PWRUP1 and a second power-up signal PWRUP2 in response to a power supply voltage signal VDD and a deep power-down mode signal DPD. The power supply voltage signal VDD may be supplied from an external device. The deep power-down mode signal DPD may be enabled to have a logic "high" level in a deep power-down mode. A level of the first power-up signal PWRUP1 may be changed from a logic "low" level to a logic "high" level when a level of the power supply voltage signal VDD increases to reach a predetermined level. The second power-up signal PWRUP2 may be generated by buffering the first power-up signal PWRUP1 out of the deep power-down mode and may be generated to have a logic "low" level in the deep power-down mode. Logic levels of the first and second power-up signals PWRUP1 and PWRUP2 may be set to be different according to the embodiments.

The fuse data storage unit 2 may include an e-fuse array (not shown) that stores fuse data FZDATA corresponding to information on abnormal memory cells. The fuse data storage unit 2 may generate a section signal BOOTUPEN which is enabled to have a logic "high" level during a predetermined period after a level of the first power-up signal PWRUP1 is changed from a logic "high" level to a logic "low" level. The fuse data storage unit 2 may generate and output a fuse reset signal FZRSTB including a pulse which is created while the section signal BOOTUPEN is enabled. While the section signal BOOTUPEN is enabled, the fuse data storage unit 2 may generate and output a fuse clock signal FZCLK which is toggled and may output the fuse data FZDATA stored therein. The fuse data storage unit 2 may generate the section signal BOOTUPEN maintaining a logic "low" level in response to the second power-up signal PWRUP2 in the deep power-down mode.

The power source signal generator 3 may drive a fuse power source signal VPERIZ in response to the power supply voltage signal VDD and the deep power-down mode signal DPD. The power source signal generator 3 may drive the fuse power source signal VPERIZ to have the power supply voltage signal VDD when a level of the power supply voltage signal VDD increases to reach a predetermined level. The power source signal generator 3 may drive the fuse power source signal VPERIZ to have a level which is lower than the power supply voltage signal VDD by a certain level while the deep power-down mode signal DPD has a logic "high" level in the deep power-down mode.

The redundancy signal generator 4 may receive the fuse power source signal VPERIZ to operate. While the section signal BOOTUPEN is enabled, the redundancy signal generator 4 may generate a redundancy signal RDY for determining whether memory cells have to be replaced with redundancy cells in response to the fuse clock signal FZCLK, the fuse reset signal FZRSTB and the fuse data FZDATA.

Figure 2:
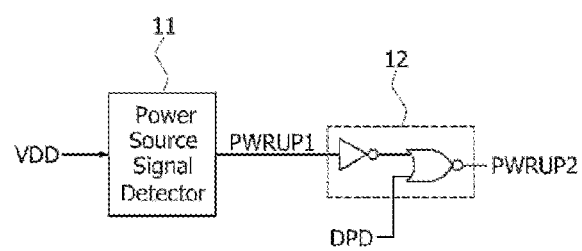
FIG. 2 is a schematic diagram illustrating a power-up signal generation circuit included in the semiconductor device of FIG. 1.

Referring to FIG. 2, the power-up signal generation circuit 1 may include a power source signal detector 11 and a signal synthesizer 12. The power source signal detector 11 may detect a level of the power supply voltage signal VDD to generate the first power-up signal PWRUP1. A level of the first power-up signal PWRUP1 may be changed from a logic "low" level to a logic "high" level when the power supply voltage signal VDD increases to reach a predetermined level. The signal synthesizer 12 may buffer the first power-up signal PWRUP1 in response to the deep power-down mode signal DPD to generate the second power-up signal PWRUP2. The second power-up signal PWRUP2 may be generated by buffering the first power-up signal PWRUP1 when the semiconductor device is out of the deep power-down mode and may be generated to have a logic "low" level in the deep power-down mode.

Figure 3:
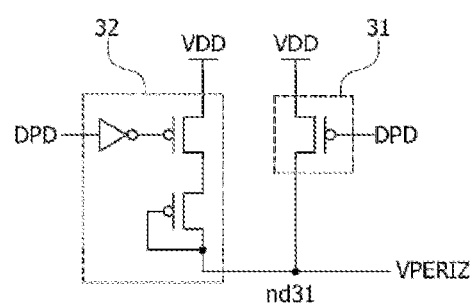
FIG. 3 is a circuit diagram illustrating a power source signal generator included in the semiconductor device of FIG. 1.

Referring to FIG. 3, the power source signal generator 3 may include a first drive element 31 and a second drive element 32. The first drive element 31 may be realized using a PMOS transistor coupled between the power supply voltage signal VDD terminal and a node ND31. The second drive element 32 may be suitable for including PMOS transistors which are serially connected between the power supply voltage signal VDD terminal and the node ND31 and an inverter which is connected to a gate of the PMOS transistor. When the semiconductor device is out of the deep power-down mode, the first drive element 31 may drive the fuse power source signal VPERIZ to have the power supply voltage signal VDD in response to the deep power-down mode signal DPD having a logic "low" level. When the semiconductor device is in the deep power-down mode, the second drive element 32 may drive the fuse power source signal VPERIZ to have a level which is lower than the power supply voltage signal VDD by a certain level in response to the deep power-down mode signal DPD having a logic "high" level. The certain level may correspond to a threshold voltage of a PMOS transistor included in the second drive element 32.

Figure 4:
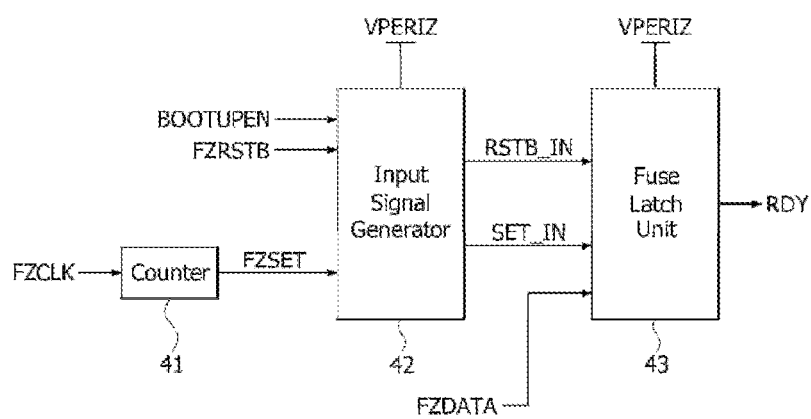
FIG. 4 is a block diagram illustrating a redundancy signal generator included in the semiconductor device of FIG. 1.

Referring to FIG. 4, the redundancy signal generator 4 may include a counter 41, an input signal generator 42 and a fuse latch unit 43. The counter 41 may output a fuse set signal FZSET that is counted in response to the fuse clock signal FZCLK. The input signal generator 42 may generate an input reset signal RSTB_IN and an input set signal SET_IN from the fuse reset signal FZRSTB and the fuse set signal FZSET in response to the section signal BOOTUPEN. The fuse latch unit 43 may generate the redundancy signal RDY in response to the input reset signal RSTB_IN, the input set signal SET_IN and the fuse data FZDATA. The input signal generator 42 and the fuse latch unit 43 may receive the fuse power source signal VPERIZ to operate. Although each of the fuse set signal FZSET, the fuse data FZDATA, the fuse reset signal FZRSTB and the redundancy signal RDY is illustrated as a single signal in FIG. 4 for the purpose of ease and convenience in explanation, each of the fuse set signal FZSET, the fuse data FZDATA, the fuse reset signal FZRSTB and the redundancy signal RDY may be realized to include the same number of signals as the memory cells that are replaced with redundancy cells.

Figure 5:
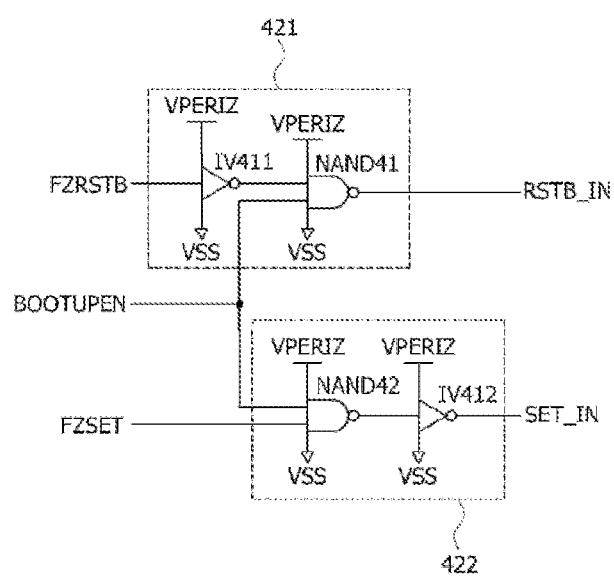
FIG. 5 is a logic circuit diagram illustrating an input signal generator included in the redundancy signal generator of FIG. 4.

Referring to FIG. 5, the input signal generator 42 may include a first input signal generator 421 and a second input signal generator 422. The first input signal generator 421 may be suitable for including an inverter IV411 and a NAND gate NAND41. The second input signal generator 422 may be suitable for including a NAND gate NAND42 and an inverter IV412. Each of the inverters IV411 and IV412 and the NAND gates NAND41 and NAND42 may receive the fuse power source signal VPERIZ and a ground voltage signal VSS to operate. The first input signal generator 421 may buffer the fuse reset signal FZRSTB to generate the input reset signal RSTB_IN during a period that the section signal BOOTUPEN is enabled to have a logic "high" level. The first input signal generator 421 may generate the input reset signal RSTB_IN having a logic "high" level during a period that the section signal BOOTUPEN is disabled to have a logic "low" level. The second input signal generator 422 may buffer the fuse set signal FZSET to generate the input set signal SET_IN during a period that the section signal BOOTUPEN is enabled to have a logic "high" level. The second input signal generator 422 may generate the input set signal SET_IN having a logic "low" level during a period that the section signal BOOTUPEN is disabled to have a logic "low" level.

Figure 6:
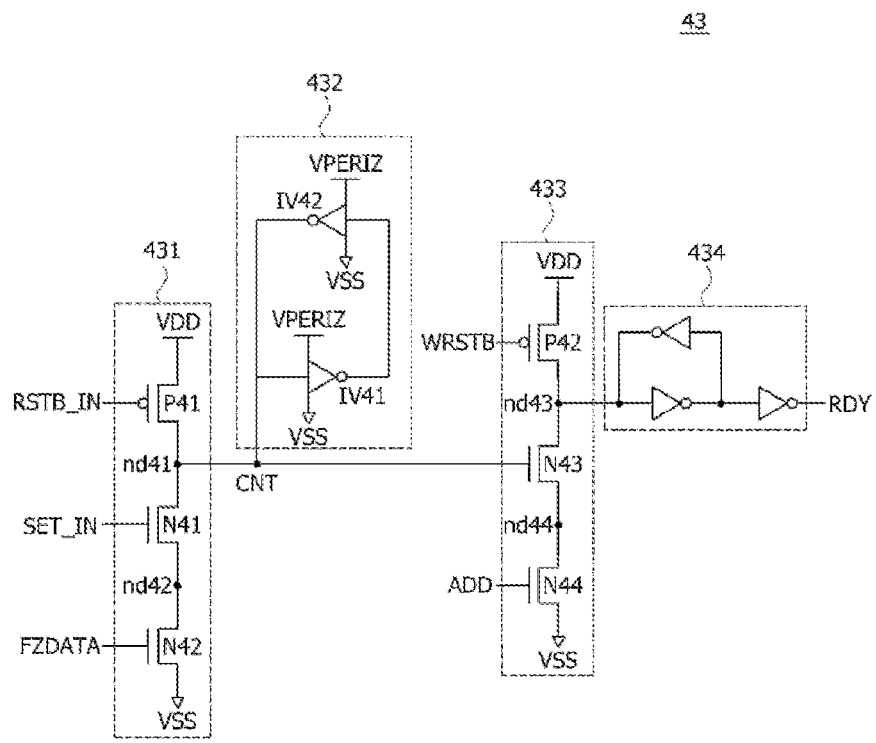
FIG. 6 is a circuit diagram illustrating a fuse latch unit included in the redundancy signal generator of FIG. 4.

Referring to FIG. 6, the fuse latch unit 43 may include a control signal driver 431, a control signal latch unit 432, an internal driver 433 and a buffer unit 434.

The control signal driver 431 may include a PMOS transistor P41 and NMOS transistors N41 and N42. The PMOS transistor P41 may be coupled between a power supply voltage signal VDD terminal and a node ND41 and may be turned on in response to the input reset signal RSTB_IN. The NMOS transistor N41 may be coupled between the node ND41 and a node ND42 and may be turned on in response to the input set signal SET_IN. The NMOS transistor N42 may be coupled between the node ND42 and a ground voltage signal VSS terminal and may be turned on in response to the fuse data FZDATA. The control signal driver 431 may drive a control signal CNT outputted through the node ND41 to have a logic "high" level when a logic "low" level pulse of the input reset signal RSTB_IN is inputted to the control signal driver 431. The control signal driver 431 may drive the control signal CNT outputted through the node ND41 to have a logic "low" level when a logic "high" level pulse of the input set signal SET_IN is inputted to the control signal driver 431 and the fuse data FZDATA having a logic "high" level is inputted to the control signal driver 431. The control signal latch unit 432 may latch the control signal CNT and include inverters IV41 and IV42. Inverters IV41 and IV42 may receive the fuse power source signal VPERIZ and the ground voltage signal VSS to operate The internal driver 433 may include a PMOS transistor P42 and NMOS transistors N43 and N44. The PMOS transistor P42 may be coupled between the power supply voltage signal VDD terminal and a node ND43 and may be turned on in response to an initialization signal WRSTB. The NMOS transistor N43 may be coupled between the node ND43 and a node ND44 and may be turned on in response to the control signal CNT. The NMOS transistor N44 may be coupled between the node ND44 and the ground voltage signal VSS terminal and may be turned on in response to an address signal ADD. The internal driver 433 may drive a signal of the node ND43 to have a logic "high" level when a logic "low" level pulse of the initialization signal WRSTB is inputted to the internal driver 433. The internal driver 433 may drive a signal of the node ND43 to have a logic "low" level if the control signal CNT has a logic "high" level while the address signal ADD having a logic "high" level is inputted to the internal driver 433. The buffer 434 may latch a signal of the node ND43 and may buffer the latched signal to generate the redundancy signal RDY.

Figure 7:
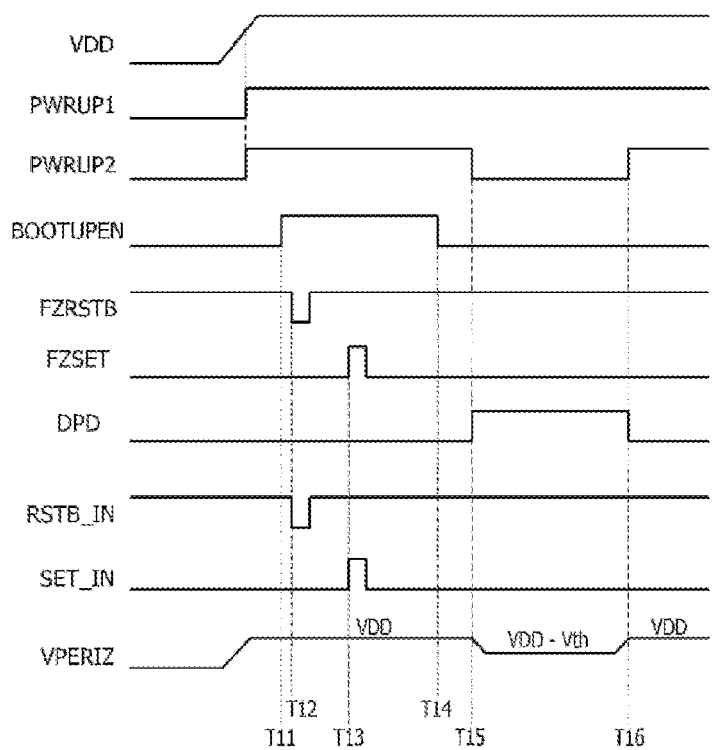
FIG. 7 is a timing diagram illustrating an operation of a semiconductor device according to some embodiments of the present invention.

An operation of the semiconductor device having the aforementioned configuration will be described hereinafter with reference to FIG. 7.

Before a point of time "T11", if a level of the power supply voltage signal VDD increases to reach a predetermined level, a level of the first power-up signal PWRUP1 may be changed from a logic "low" level to a logic "high" level and the fuse power source signal VPERIZ may be driven to have the power supply voltage signal VDD.

During a period between the point of time "T11" and a point of time "T14", the section signal BOOTUPEN may be enabled to have a logic "high" level. While the section signal BOOTUPEN is enabled, a pulse of the fuse reset signal FZRSTB and a pulse of the fuse set signal FZSET counted in response to the fuse clock signal FZCLK may be sequentially created. That is, a logic "low" level pulse of the fuse reset signal FZRSTB may be created at a point of time "T12" and a logic "high" level pulse of the fuse set signal FZSET may be created at a point of time "T13".

During a period between a point of time "T15" and a point of time "T16", the deep power-down mode signal DPD may be enabled to have a logic "high" level such that the semiconductor device operates in the deep power-down mode. While the deep power-down mode signal DPD is enabled to have a logic "high" level, the fuse power source signal VPERIZ may be driven to have a voltage level which is lower than the power supply voltage signal VDD by a threshold voltage Vth of an NMOS transistor in the second drive element 32. Even though the semiconductor device operates in the deep power-down mode, the fuse power source signal VPERIZ may be continuously supplied to the control signal latch unit 432 latching the control signal CNT to prevent the latched data from being lost. In the deep power-down mode, the second power-up signal PWRUP2 may be generated to have a logic "low" level to control such that the section signal BOOTUPEN maintains a logic "low" level. Thus, a boot-up operation is not executed in the deep power-down mode. While the section signal BOOTUPEN has a logic "low" level, the input reset signal RSTB_IN may be set to have a logic "high" level and the input set signal SET_IN may be set to have a logic "low" level. Thus, current paths in the fuse latch unit 43 may be electrically opened to minimize a leakage current of the fuse latch unit 43.

What is claimed is:

1. A semiconductor device comprising:
   a fuse data storage unit suitable for generating a section signal, a fuse clock signal, a fuse reset signal and fuse data in response to a first power-up signal generated from a power supply voltage signal; and
   a redundancy signal generator suitable for generating a fuse set signal that is counted in response to the fuse clock signal, suitable for generating an input reset signal and an input set signal from the fuse set signal and the fuse reset signal in response to the section signal, and suitable for latching the fuse data in response to the input reset signal and the input set signal to generate a redundancy signal.

2. The semiconductor device of claim 1, wherein the redundancy signal generator further includes a counter outputting the fuse set signal that is counted in response to the fuse clock signal.

3. The semiconductor device of claim 1, wherein the redundancy signal generator includes:
   a first input signal generator suitable for buffering the fuse reset signal to generate the input reset signal during a period that the section signal is enabled and generate the input reset signal having a high level during a period that the section signal is disabled; and
   a second input signal generator suitable for buffering the fuse set signal to generate the input set signal during the period that the section signal is enabled and generate the input set signal having a low level during the period that the section signal is disabled.

4. The semiconductor device of claim 1, wherein a level of the first power-up signal is changed when the power supply voltage signal reaches a predetermined level.

5. The semiconductor device of claim 1, wherein the fuse data storage unit includes a fuse array that stores the fuse data.

6. The semiconductor device of claim 5, wherein the fuse data includes information that corresponds to abnormal memory cells.

7. The semiconductor device of claim 1,
   wherein each of the fuse reset signal and the fuse set signal includes a pulse; and
   wherein the pulse of the fuse reset signal and the pulse of the fuse set signal are sequentially created while the section signal is enabled.

8. The semiconductor device of claim 7, wherein the input reset signal and the input set signal are generated by buffering the fuse reset signal and the fuse set signal while the section signal is enabled.

9. The semiconductor device of claim 8, wherein the input reset signal and the input set signal are set to have predetermined levels while the section signal is disabled.

10. The semiconductor device of claim 9, wherein the section signal is set to maintain a disabled state during the deep power-down mode.

11. The semiconductor device of claim 1, wherein the redundancy signal generator includes a fuse latch unit that generates the redundancy signal for determining whether a memory cell accessed by an address signal has to be replaced with a redundancy cell according to a level of the fuse data at a point of time that a pulse of the input set signal is created.

12. The semiconductor device of claim 11,
wherein the fuse latch unit is operated by the fuse power source signal driven to the power supply voltage signal; and
wherein the fuse power source signal is set to have a lower level than the power supply voltage signal by a certain level in the deep power-down mode.

13. The semiconductor device of claim 12, further including a power source signal generator suitable for generating a fuse power source signal driven to have the power supply voltage signal, the fuse power source signal being generated to have a lower level than the power supply voltage signal by a certain level in a deep power-down mode.

14. The semiconductor device of claim 12, wherein the certain level corresponds to a threshold voltage of a MOS transistor included in the power source signal generator.

15. The semiconductor device of claim 13, wherein the power source signal generator further includes:
a first drive element suitable for receiving the power supply voltage signal and a deep power-down mode signal and drive the fuse power source signal to have the power supply voltage signal in response to the deep power-down mode signal having a low level; and
a second drive element suitable for receiving the power supply voltage and the deep power-down mode signal and drive the fuse power source signal to have a level which is lower than the power supply voltage signal by a certain level in response to the deep power-down mode signal having a high level.

16. The semiconductor device of claim 14, wherein the fuse latch unit includes:
a control signal driver suitable for driving a control signal in response to the input reset signal, the input set signal and the fuse data;
a control signal latch unit suitable for receiving the fuse power source signal to latch the control signal;
an internal driver suitable for driving an internal node in response to the control signal, the address signal and an initialization signal; and
a buffer suitable for buffering a signal of the internal node to generate the redundancy signal.

17. The semiconductor device of claim 16,
wherein the control signal driver drives the control signal to a first level when a pulse of the input set signal is inputted to the control signal driver; and
wherein the control signal driver drives the control signal to a second level when the fuse data is inputted to the control signal driver while the pulse of the input set signal is inputted to the control signal driver.

18. The semiconductor device of claim 16, wherein the internal driver is suitable for determining whether the internal node has to be driven to have the second level according to a level of the control signal while the address signal is inputted after the internal node is driven to have the first level in response to the initialization signal.

19. A semiconductor device comprising:
a power source signal generator suitable for generating a fuse power source signal driven to have a power supply voltage signal, the fuse power source signal being generated to have a lower level than the power supply voltage signal by a certain level in a deep power-down mode; and
a redundancy signal generator suitable for generating a fuse set signal that is counted in response to a fuse clock signal, suitable for generating an input reset signal and an input set signal from the fuse set signal and a fuse reset signal in response to a section signal, and suitable for latching fuse data in response to the input reset signal and the input set signal to generate a redundancy signal.

20. The semiconductor device of claim 19, wherein the redundancy signal generator further includes a counter outputting the fuse set signal that is counted in response to the fuse clock signal.

21. The semiconductor device of claim 19, wherein the certain level corresponds to a threshold voltage of a MOS transistor included in the power source signal generator.

22. The semiconductor device of claim 19, wherein the input reset signal and the input set signal are generated by buffering the fuse reset signal and the fuse set signal while the section signal is enabled.

23. The semiconductor device of claim 22, wherein the input reset signal and the input set signal are set to have predetermined levels while the section signal is disabled.

24. The semiconductor device of claim 23, wherein the section signal is set to maintain a disabled state during the deep power-down mode.

25. The semiconductor device of claim 19, wherein the redundancy signal generator includes a fuse latch unit that generates the redundancy signal for determining whether a memory cell accessed by an address signal has to be replaced with a redundancy cell according to a level of the fuse data at a point of time that a pulse of the input set signal is created.

26. The semiconductor device of claim 25, wherein the fuse latch unit includes:
a control signal driver suitable for driving a control signal in response to the input reset signal, the input set signal and the fuse data;
a control signal latch unit suitable for receiving the fuse power source signal to latch the control signal;
an internal driver suitable for driving an internal node in response to the control signal, the address signal and an initialization signal; and
a buffer suitable for buffering a signal of the internal node to generate the redundancy signal.

* * * * *